(12) United States Patent
Shibata et al.

(10) Patent No.: US 8,457,166 B2
(45) Date of Patent: Jun. 4, 2013

(54) METHOD OF CONTROLLING WAVELENGTH-TUNABLE LASER

(71) Applicant: Sumitomo Electric Device Innovations, Inc., Yokohama (JP)

(72) Inventors: Masao Shibata, Kanagawa (JP); Hirokazu Tanaka, Yokohama (JP); Tsutomu Ishikawa, Yokohama (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 0 days.

(21) Appl. No.: 13/644,860

(22) Filed: Oct. 4, 2012

(65) Prior Publication Data
US 2013/0039370 A1    Feb. 14, 2013

Related U.S. Application Data

(62) Division of application No. 13/029,539, filed on Feb. 17, 2011, now Pat. No. 8,311,068.

(30) Foreign Application Priority Data

Feb. 18, 2010    (JP) ................................ 2010-033273

(51) Int. Cl.
    *H01S 3/10*    (2006.01)
(52) U.S. Cl.
    USPC ............. 372/20; 372/25; 372/29.014; 372/30

(58) Field of Classification Search
    USPC ................................................ 372/20, 25, 30
    See application file for complete search history.

(56) References Cited

U.S. PATENT DOCUMENTS

| 6,058,130 A * | 5/2000 | Shinji et al. ..................... 372/99 |
| 2007/0036188 A1 | 2/2007 | Fujii |
| 2010/0296532 A1* | 11/2010 | Tanaka et al. ................... 372/20 |

FOREIGN PATENT DOCUMENTS

JP    2007-048988 A    2/2007

* cited by examiner

*Primary Examiner* — Dung Nguyen
(74) *Attorney, Agent, or Firm* — Westerman, Hattori, Daniels & Adrian, LLP

(57) ABSTRACT

A method of controlling a wavelength-tunable laser selecting an oscillation wavelength with a combination of a plurality of wavelength selection portions of which wavelength peak is different from each other, comprising: a first step of confirming a control direction of the wavelength selection portion in a case where a setting value is changed from a first setting value for achieving the first wavelength to a second setting value for achieving the second wavelength; a second step of setting a setting value that is shifted from the second setting value in a direction that is opposite of a pre-determined changing direction on the wavelength selection portion as a prepared setting value, when the control direction confirmed in the first step is opposite to the pre-determined changing direction; and a third step of changing the prepared setting value set in the second step to the second setting value.

6 Claims, 7 Drawing Sheets

METHOD OF CONTROLLING WAVELENGTH-TUNABLE LASER

CROSS-REFERENCE TO RELATED APPLICATION

This application is a divisional of Ser. No. 13/029,539, filed Feb. 17, 2011, which is based upon and claims the benefit of priority of the prior Japanese Patent Application No. 2010-033273, filed on Feb. 18, 2010, the entire contents of which are incorporated herein by reference.

BACKGROUND (i) Technical Field

The present invention relates to a method of controlling a wavelength-tunable laser.

(ii) Related Art

Generally, a wavelength-tunable laser oscillates at a desirable wavelength by varying wavelength characteristics of a resonator. Typically, a mirror included in the resonator has wavelength characteristics in order to vary the wavelength characteristics of the resonator. The wavelength characteristics of the mirror are controlled so that a resonant condition of the resonator fits a desirable oscillation wavelength. Another wavelength-tunable laser has a plurality of ring resonators and controls an oscillation condition by controlling the resonant condition. Japanese Patent Application Publication No. 2007-48988 discloses the wavelength-tunable lasers.

A given setting value is provided to each part of the wavelength-tunable laser in order to achieve a desirable oscillation wavelength. For example, a setting value is provided to a gain electrode for setting a gain of the resonator, a heater for controlling wavelength characteristics of DBR (Distributed Reflector) region, and a temperature control device for controlling wavelength characteristics of a DFB (Distributed Feedback) region and a laser oscillation.

A number of wavelength channels is set in a narrow band in a wavelength-tunable laser used in a WDM communication technology. Therefore, an interval of each channel is very narrow. For example, a C-band has 89 channels in a wavelength band from 1528.773 nm to 1563.863 nm. Therefore, a frequency difference between each channel is 50 GHz (approximately 0.4 nm as wavelength difference).

The wavelength channel is defined with a narrow wavelength interval. However, the wavelength-tunable laser has a number of elements to be controlled. Accordingly, only a narrow control range is allowed in a setting value of each element.

SUMMARY

It is an object of the present invention to provide a method of controlling a wavelength-tunable laser that controls an oscillation wavelength with high controllability.

According to an aspect of the present invention, there is provided a method of controlling a wavelength-tunable laser selecting an oscillation wavelength with a combination of a plurality of wavelength selection portions of which wavelength peak is different from each other, in a case where a setting value of at least one of the wavelength selection portions is controlled in a process in which the oscillation wavelength is changed from a first wavelength to a second wavelength, comprising: a first step of confirming a control direction of the wavelength selection portion in a case where a setting value is changed from a first setting value for achieving the first wavelength to a second setting value for achieving the second wavelength; a second step of setting a setting value that is shifted from the second setting value in a direction that is opposite of a pre-determined changing direction on the wavelength selection portion as a prepared setting value, when the control direction confirmed in the first step is opposite to the pre-determined changing direction; and a third step of changing the prepared setting value set in the second step to the second setting value.

According to another aspect of the present invention, there is provided a method of controlling a wavelength-tunable laser selecting an oscillation wavelength with a combination of a plurality of wavelength selection portions of which wavelength peak is different from each other, in a case where a setting value of at least one of the wavelength selection portions is controlled in a process in which the oscillation wavelength is changed from a first wavelength to a second wavelength, comprising: a first step of changing a first setting value for achieving the first wavelength set on the wavelength selection portion to an initial setting value acting as a starting point of a control direction determined in advance; and a second step of changing the initial setting value set on the wavelength selection portion in the first step to a second setting value for achieving the second wavelength.

According to another aspect of the present invention, there is provided a method of controlling a wavelength-tunable laser having a plurality of wavelength selection portions and a gain region, the plurality of the wavelength selection portions, of which wavelength peak is different from each other, selecting an oscillation wavelength with a combination thereof, in a starting of the wavelength tunable laser, comprising: a first step of setting an initial setting value for achieving a starting point of a control direction determined in advance on the wavelength selection portion and setting a gain setting value for achieving a predetermined gain on the gain region; and a second step of setting a target wavelength setting value for achieving a pre-determined oscillation wavelength on the wavelength selection portion after the first step.

According to another aspect of the present invention, there is provided a method of controlling a wavelength-tunable laser having a plurality of wavelength selection portions and a gain region, the plurality of the wavelength selection portions, of which wavelength peak is different from each other, selecting an oscillation wavelength with a combination thereof, in a starting of the wavelength tunable laser, comprising: a first step of setting a target wavelength setting value for achieving a pre-determined oscillation wavelength on the wavelength selection portion and setting a gain setting value for achieving a gain on the gain region; a second step of setting an initial setting value acting as a starting point of a control direction determined in advance on the wavelength selection portion; and a third step of setting the target wavelength setting value on the wavelength selection portion.

DETAILED DESCRIPTION

A description will be given of a best mode for carrying the present invention.

First Embodiment

Figure 1:
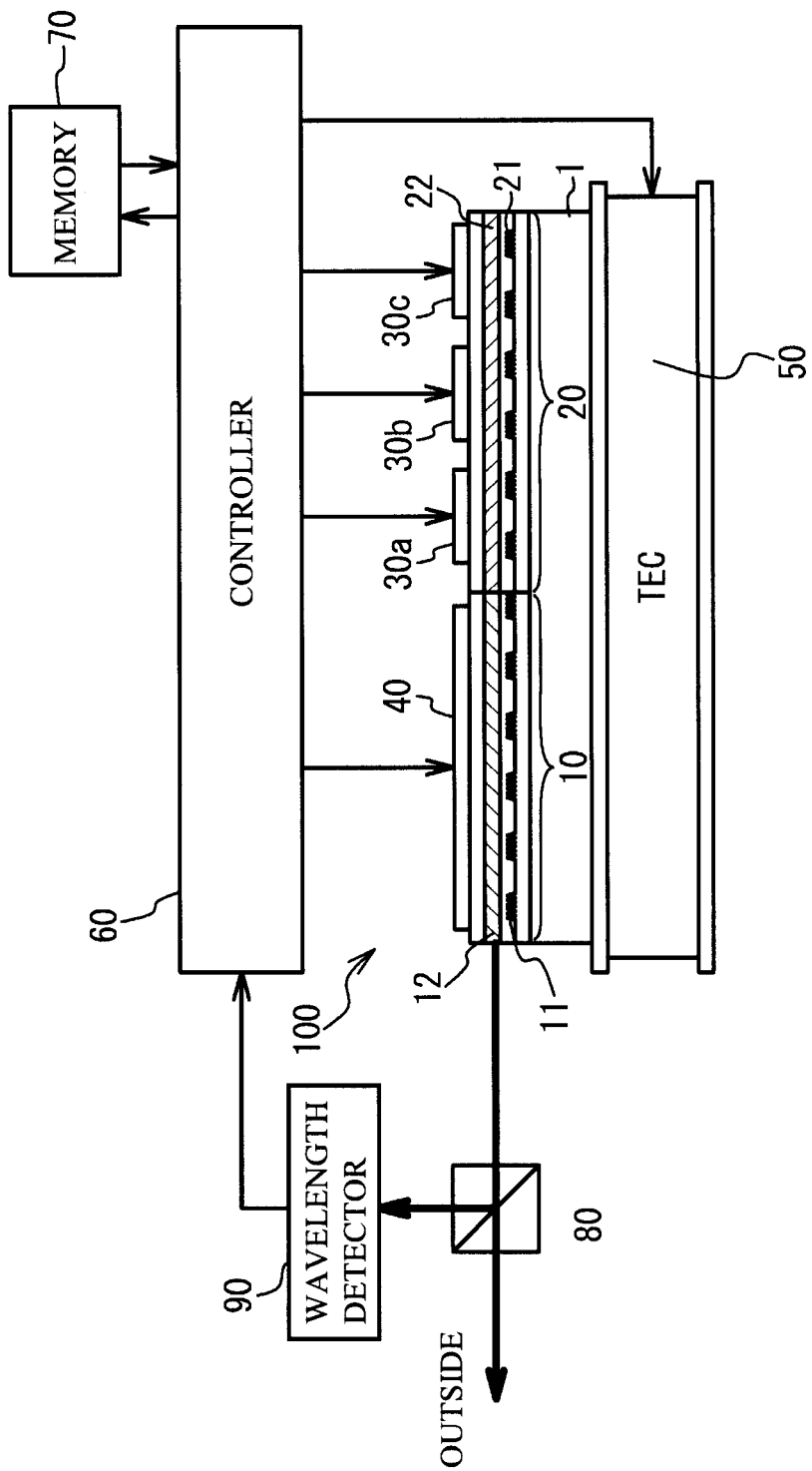
FIG. 1 illustrates an example of a wavelength-tunable laser.

FIG. 1A illustrates an example of a wavelength-tunable laser 100 and a laser device 200 having the same. The wavelength-tunable laser 100 has a structure in which a SG-DFB (Sampled Grating Distributed Feedback) region 10 and a CSG-DBR (Chirped Sampled Grating Distributed Reflector) region 20 formed on a semiconductor substrate 1 are optically coupled to each other. The wavelength-tunable laser 100 is provided on a temperature control device 50. The temperature control device 50 may use a peltier element.

The SG-DFB region 10 has a structure in which a corrugation 11 is formed at a given interval. The SG-DFB region 10 has a gain when a current is provided to an active layer 12 from a gain electrode 40. The SG-DFB region 10 has wavelength characteristics in which the active layer 12 has gain peaks at a given wavelength interval, because the corrugation 11 is formed at a given interval. Each interval of the corrugation 11 is substantially the same in the SG-DFB region 10.

A corrugation 21 is formed at a given interval in the CSG-DBR region 20. The interval of the corrugation 21 is different from that of the corrugation 11. At least two of the intervals of the corrugation 21 are different from each other. An optical waveguide layer 22 of the CSG-DBR region 20 has a reflection peak at a given interval that is different from the gain peak of the active layer 12. The reflection intensity may be different from each other in the CSG-DBR region 20. Heaters 30a through 30c are provided on the CSG-DBR region 20 in a longitudinal direction of the optical waveguide layer 22. The wavelength characteristics of the CSG-DBR region 20 may be controlled with a temperature control of the heaters 30a through 30c.

A controller 60 controls the wavelength-tunable laser 100. The controller 60 has a CPU (Central Processing Unit), a RAM (Random Access Memory), an input/output interface and so on. The controller 60 sets a setting value on the gain electrode 40, the heaters 30a through 30c and the temperature control device 50. The setting value is set as an electrical signal such as a current, a voltage or the like.

A driving current is provided to the gain electrode 40 so that a gain required for a desirable laser oscillation is achieved in a resonator. Each temperature of the heaters 30a through 30c is controlled so that a desirable oscillation wavelength is achieved. A memory 70 stores a temperature condition of the heaters 30a through 30c with respect to each target oscillation wavelength. The controller 60 accesses the memory 70 based on target wavelength information and reads necessary information. The temperature control device 50 controls the temperature of the corrugations 11 formed at an interval and the active layer 12 and thereby controls refractive index of the SG-DFB region 10.

The controller 60 controls above-mentioned temperature with the temperature control device 50 according to wavelength information that is output from the wavelength-tunable laser 100 and is detected through a beam splitter 80 and a wavelength detection portion 90. The oscillation wavelength is controlled with the temperature control of the temperature control device 50.

The controller 60 controls the wavelength characteristics of the SG-DFB region 10 of the wavelength-tunable laser 100 with use of the refractive index variation of the active layer 12 controlled with the temperature control of the temperature control device 50. The controller 60 controls the wavelength characteristics of the CSG-DBR region 20 of the wavelength-tunable laser 100 with use of the refractive index variation of the optical waveguide layer 22 controlled with the temperature control of the heaters 30a through 30c and the temperature control device 50.

With the structure, an overlap of the gain peak of the SG-DFB region 10 and the reflection peak of the CSG-DBR region 20 may be controlled, and a desirable oscillation wavelength may be selected.

Figure 2A:
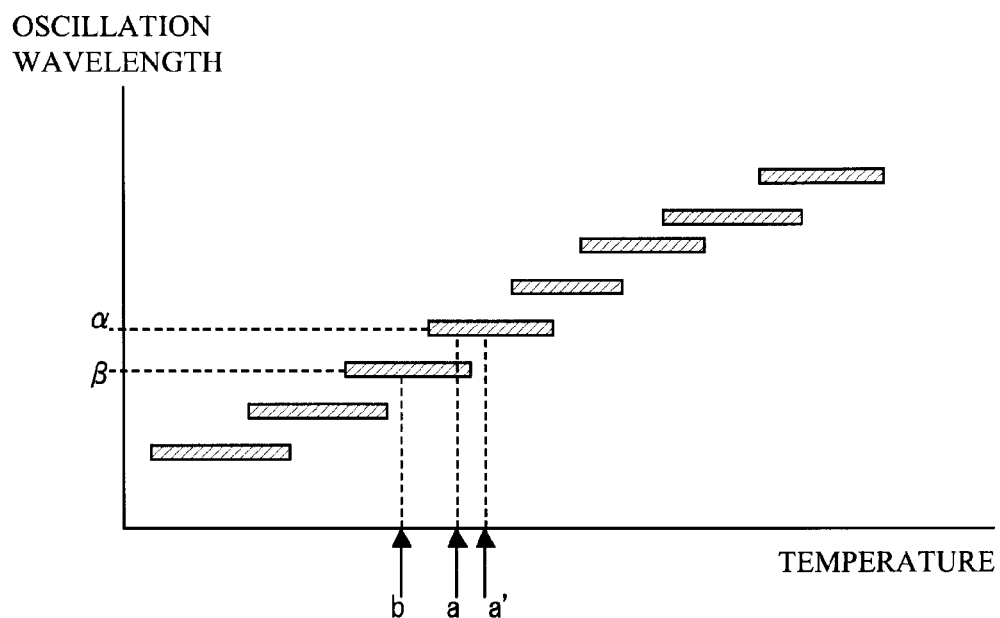
FIGS. 2A and 2B illustrate a relationship between a temperature condition of a heater and an oscillation wavelength.

FIG. 2A illustrates a correlation of an oscillation wavelength of the wavelength-tunable laser 100 in a case where each temperature difference between the heaters 30a through 30c provided on the CSG-DBR region 20 of the wavelength-tunable laser 100 is kept constant and the temperature of the heaters 30a through 30c is varied. The variation of the temperature of the heaters 30a through 30c corresponds to a selection of the oscillation wavelength of the wavelength-tunable laser 100.

As illustrated in FIG. 2A, the oscillation wavelength skips with respect to the temperature variation of the heaters 30a through 30c. A combination of the wavelength characteristics of the SG-DFB region 10 and the CSG-DBR region 20 has an interval of a wavelength peak. Here, an area where an oscillation wavelength is kept substantially constant with respect to the temperature variation of the heaters 30a through 30c is hereinafter referred to as a terrace.

As illustrated in FIG. 2A, a part of the terraces adjacent to each other overlaps with each other. That is, two wavelengths may be selected at a specific temperature condition. This means when the wavelength-tunable laser 100 oscillates at a wavelength, a temperature of the heaters has to be changed dynamically to another temperature of the heaters where oscillation wavelengths does not overlap with each other, in order to change the oscillation wavelength to an adjacent one. When a laser oscillation is achieved once, a carrier is induced to the oscillation condition. Accordingly, the oscillation condition is not easily changed to the adjacent one. Thus, one oscillation wavelength overlaps with another one. The overlapping is observed in other wavelength-tunable lasers.

The overlapping may cause difficulty of the temperature of the heaters setting to achieve each oscillation wavelength. As mentioned above, the temperature of the heaters 30a through 30c is determined by tuning with respect to each oscillation wavelength according to each wavelength channel. Here, as illustrated in FIG. 2A, it is assumed that the temperature of the heaters achieving oscillation wavelengths adjacent to each other are determined a condition "a" and a condition "b". The condition "a" is a temperature condition where the oscillation wavelength α overlaps with the oscillation wavelength β. The condition "b" is a temperature condition where the oscillation wavelength β does not overlap with another oscillation wavelength.

For example, electrical power according to the condition "b" has only to be provided in order to change an oscillation wavelength to the oscillation wavelength β, when electrical power of the heaters according to the condition "a" is provided in a condition that the oscillation is achieved at the oscillation wavelength α. However, the oscillation wavelength is kept at the oscillation wavelength β, even if the electrical power according to the condition "a" is provided in a condition that the electrical power of the heaters according to the condition "b" is provided and the oscillation at the oscillation wavelength β is achieved. Therefore, the oscillation wavelength is not changed to the oscillation wavelength α. This is because the oscillation condition is on the overlapping condition. It is therefore necessary to provide an electrical power of the heaters according to the condition "a'" in order to achieve the oscillation at the oscillation wavelength α. The condition "a'" is a temperature condition where the oscillation wavelength α doe not overlap with another one. Therefore, the temperature of the condition "a'" is higher than that of the condition "a". Accordingly, it is necessary to set the temperature of the heaters in an area where each terrace does not overlap with each other, when the oscillation wavelength is changed to an adjacent one.

The overlapping of each terrace has a correlation with an interval of each oscillation wavelength (that is, an interval of each wavelength channel). When the interval of each oscillation wavelength is narrow, an overlapping range gets broader. Therefore, a condition for changing the oscillation wavelength to an adjacent one (that is, a condition where terraces do not overlap with each other) gets narrower when the interval of the oscillation wavelength is reduced.

Figure 2B:
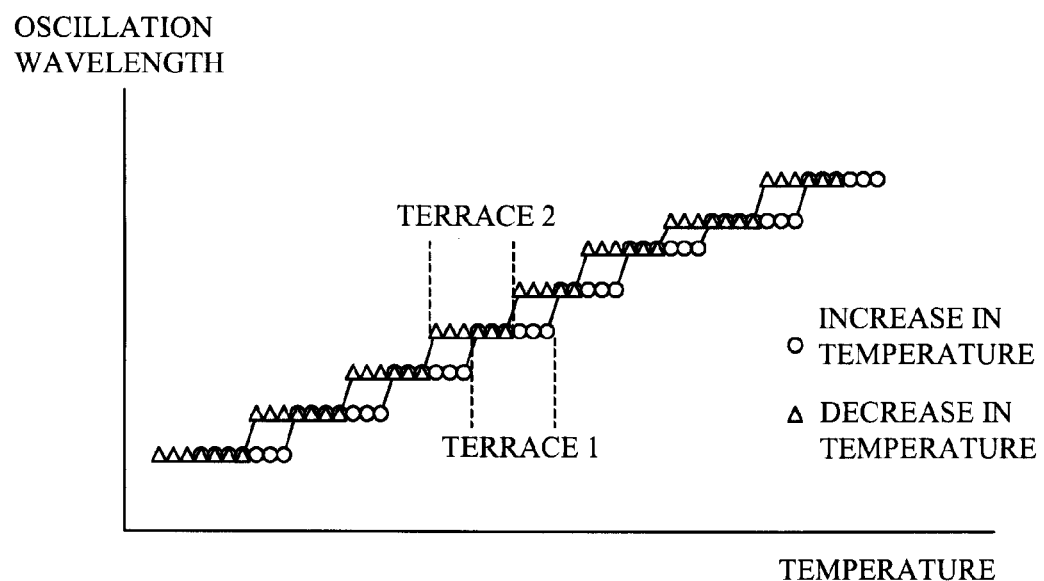

On the other hand, the inventor has researched a difference of a terrace caused by a changing direction of the temperature of the heater. FIG. 2B illustrates the difference of the terrace caused by the changing direction of the temperature of the heater in FIG. 2A. In FIG. 2B, a circle indicates a changing of an oscillation wavelength of a case where the temperature of the heaters 30a through 30c is changed from a lower one to a higher one in a single direction. In FIG. 2B, a triangle indicates a changing of the oscillation wavelength of a case where the temperature of the heaters 30a through 30c is changed from a higher one to a lower one in a single direction.

As illustrated in FIG. 2B, an overlapping is not observed in a temperature of the heater for changing the oscillation wavelength to an adjacent one, when the changing direction of temperature is fixed to only one of an increasing direction and a descending direction. Therefore, a terrace range for changing the oscillation wavelength to an adjacent one is enlarged. Based on the research, a description will be given of the embodiment.

Figure 3:
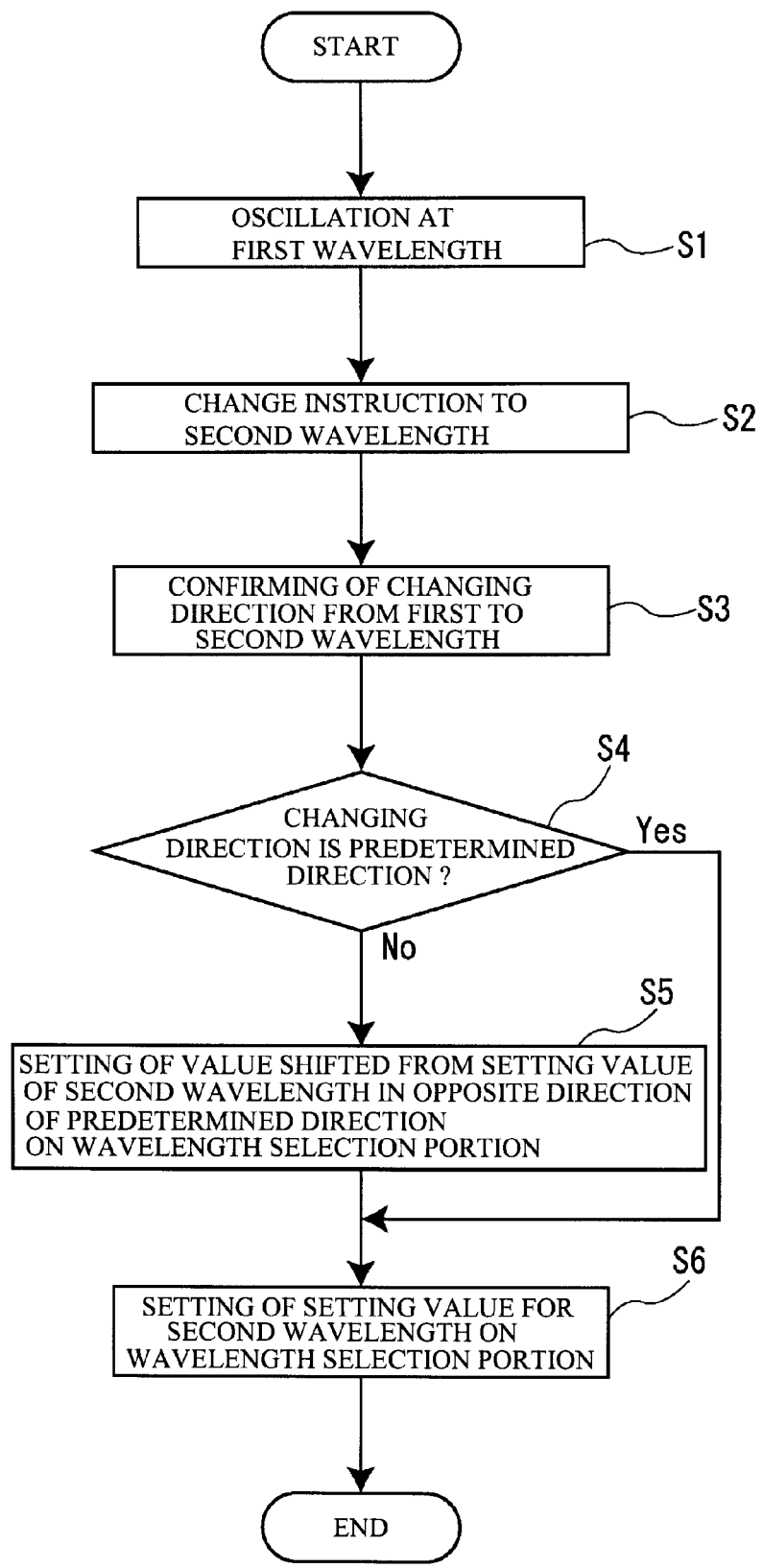
FIG. 3 illustrates a control flowchart for describing a first embodiment.
Figure 4:
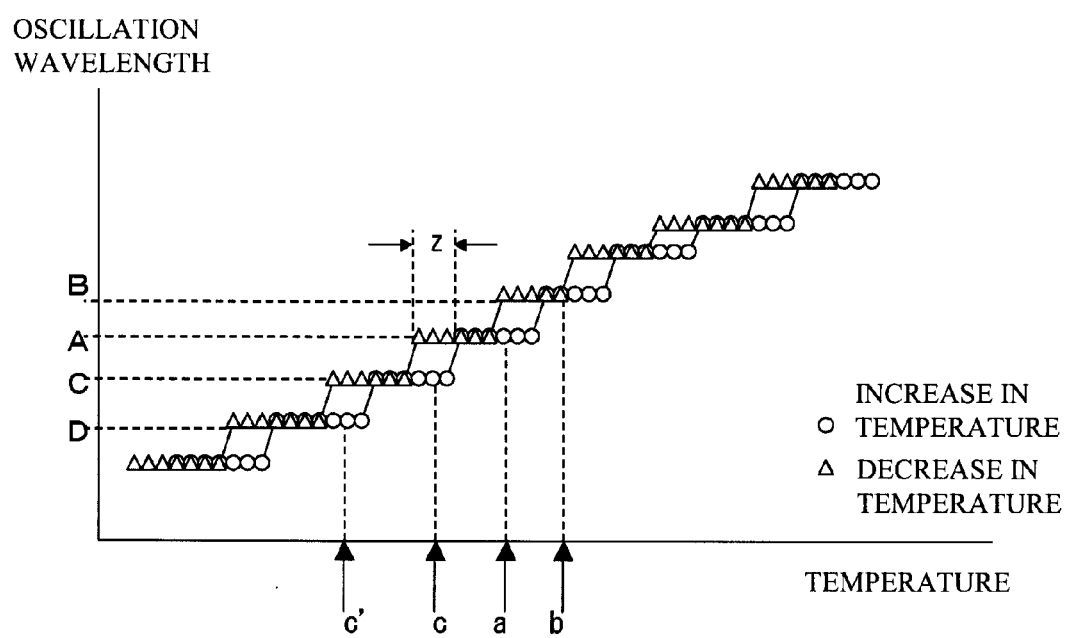
FIG. 4 illustrates a setting value of a wavelength selection portion in a case where the control flowchart of FIG. 3 is executed.

FIG. 3 illustrates a control flowchart for describing the first embodiment. FIG. 4 illustrates a setting value of a wavelength selection portion in a case where the control flowchart of FIG. 3 is executed. In the embodiment, knowledge of the present invention is adapted to a case where an oscillation wavelength of the wavelength-tunable laser 100 is changed from a first wavelength to a second wavelength.

The controller 60 sets a setting value for achieving an oscillation at the first wavelength on the wavelength-tunable laser 100. A setting value for achieving the oscillation at the first wavelength is set on the gain electrode 40, the heaters 30a through 30c, and the temperature control device 50 of the wavelength-tunable laser 100. The setting value is read from the memory 70. Temperature setting value of the heaters 30a through 30c for achieving each oscillation wavelength is set in a temperature condition where each terrace does not overlap with each other.

The wavelength-tunable laser 100 laser-oscillates when the setting values are set on each element. The oscillation wavelength obtained by the laser oscillation is a wavelength that is output because of overlapping of the wavelength characteristics of the SG-DFB region 10 and the wavelength characteristics of the CSG-DBR region 20. The overlapping allows a wavelength range. The wavelength-tunable laser 100 oscillates at any wavelength in the wavelength range.

The controller 60 calculates a difference between wavelength information obtained through the beam splitter 80 and the wavelength detection portion 90 and a target wavelength. The temperature control device 50 uses the calculated wavelength difference information. The temperature control device 50 varies refractive index of the resonator according to the temperature variation. Thus, the temperature control device 50 uses the characteristics and moves the oscillation wavelength to the target wavelength. The operation is called AFC (Auto Frequency Control).

With the control, the wavelength-tunable laser 100 oscillates at the first wavelength (Step S1). In Step S1, a setting value is set on the heaters 30a through 30c in order to output the first wavelength. The condition is a control point "a" of FIG. 4.

Next, a command structure gives an instruction so that the oscillation wavelength is changed to the second wavelength in Step S2 of FIG. 3. Next, a changing direction from the first wavelength to the second wavelength is confirmed in Step S3 of FIG. 3. For example, when the second wavelength is a wavelength "B" of FIG. 4, the temperature of the heaters 30a through 30c is increased to the point "b". This changing direction is defined as a changing direction "plus". On the contrary, when the second wavelength is a wavelength "C" of FIG. 4, the temperature of the heaters 30a through 30c are decreased to the point "c". This changing direction is defined as a changing direction "minus".

Next, it is determined whether the control direction confirmed in Step S3 corresponds to a setting direction (changing direction) determined in advance (Step S4). As mentioned above, when the changing direction of temperature is a single direction, the wavelength characteristics do not overlap with each other. And so, in the embodiment, the changing direction of the temperature is determined to one of an increasing direction and a decreasing direction in advance. In the embodiment, the changing direction of the temperature is the increasing direction (the changing direction "plus").

If the changing direction confirmed in Step S3 is the changing direction "plus", the changing direction confirmed in Step S3 is the same as the direction determined in advance. Accordingly, Step S6 is executed. In Step S6, the temperature of the heaters 30a through 30c are increased to the point "b" of FIG. 4 as a setting value for achieving the second wavelength. With the control, the wavelength-tunable laser 100 oscillates at the second wavelength (the wavelength "B").

Next, a description will be given of a case where the changing direction confirmed in Step S3 is the changing direction "minus". If the changing direction confirmed in Step S3 is the changing direction "minus", Step S5 is executed. In Step S5, a value that is shifted from a setting value for achieving the objective second wavelength (the wavelength C) in a direction that is opposite to the pre-determined changing direction is set as a prepared setting value. That is, as illustrated in FIG. 4, a setting value (temperature "c'") that is positioned in an opposite side (the changing direction "minus" that is opposite to the pre-determined changing direction "plus") of a setting value (temperature "c") for achieving the wavelength "C" is set when the second wavelength is the wavelength "C". In FIG. 4, it is not determined whether the laser oscillation is achieved at the wavelength "C" or the wavelength "D", because the temperature "c'" is an area where the terrace of the wavelength "C" overlaps with that of the wavelength "D".

Next, Step S6 is executed. In Step S6, a setting value for achieving the second wavelength is set. Here, the temperature of the heaters 30a through 30c is controlled to be the point "c". The control direction of the temperature is the increasing direction (the changing direction "plus") from the temperature "c'". Therefore, the temperature is controlled in the direction corresponding to the changing direction determined in advance. And, the temperature is controlled to the temperature "c" finally. As illustrated in FIG. 4, the point "c" is an area where the terrace of the wavelength "A" and the terrace of the wavelength "C" overlap with each other. In accordance with the above-mentioned description, the wavelength-tunable laser 100 oscillates at the wavelength "C" certainly.

The point "c'" determined in Step S5 may be a value that is smaller than the target point "c". That is, the point "c'" may be a value positioned in a direction that is an opposite of the changing direction determined in advance. However, as illustrated in FIG. 4, when an overlapping range is large, it is necessary to determine the point "c'" that exceeds a range indicated with "z" in FIG. 4. In FIG. 4, the range indicated with "z" is an area where the terrace of the wavelength "C" (the second wavelength) overlaps with the terrace of the wavelength "A" that is adjacent to the wavelength "C".

The temperature "c'" in the embodiment overlaps with the terrace of the wavelength "D" adjacent to the wavelength "C" (the second wavelength). After that, the temperature is controlled to the point "c" in Step S6. Therefore, it is not a problem, even if the wavelength-tunable laser 100 oscillates at the wavelength "D" when the point "c'" is set. It is not a problem, even if the point "c'" is set to be further low value. For example, the same effect can be obtained, if the temperature of the heaters 30a through 30c is increased to the point "c" after the driving current of the heaters 30a through 30c are set to be zero.

In accordance with the embodiment, a desirable oscillation wavelength can be selected with a simple structure. It is therefore possible to control an oscillation wavelength with high controllability.

The embodiment may be modified. In the embodiment, the changing direction is the increasing direction of temperature. However, the same effect can be obtained when the temperature is controlled in a reverse direction, if the changing direction is the decreasing direction of the temperature. In the embodiment, the wavelength-tunable laser 100 uses the heaters 30a through 30c as a wavelength selection portion. However, a wavelength-tunable laser varying refraction index with use of current injection instead of the heaters may be used.

The embodiment solves a problem of the overlapping of the terraces that is occurred inevitably in the wavelength-tunable laser of which wavelength characteristics has the terrace. The wavelength characteristics having the terrace is occurred in a wavelength-tunable laser having a resonator including a plurality of wavelength control portions of which wavelength characteristics obtained at an interval. Therefore, the control in accordance with the embodiment can be adapted to another wavelength-tunable laser.

For example, the embodiment can be adapted to a wavelength-tunable laser having a resonator in which a two SG-DBR mirror having corrugations at an interval are provided, a wavelength-tunable laser oscillating at a desirable wavelength with use of a combination of ring resonators, or the like. The modification is adapted to the following second embodiment through the fourth embodiment.

Second Embodiment

Figure 5A:
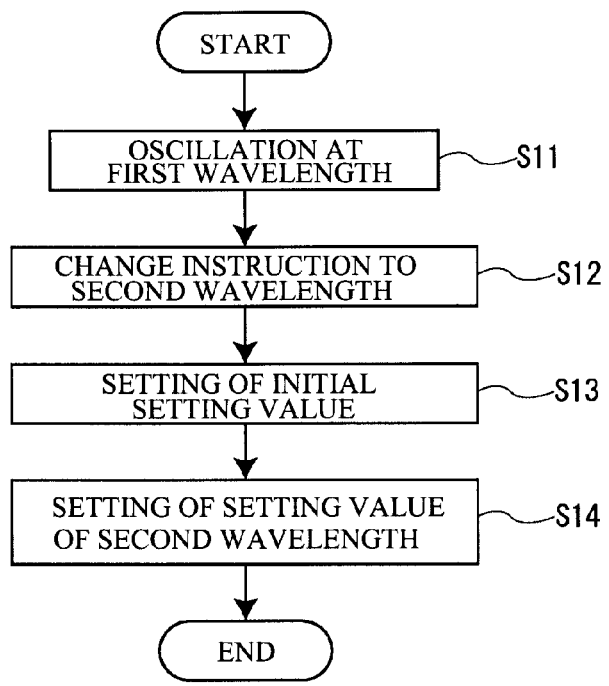
FIG. 5A illustrates a control flowchart for describing a second embodiment.
Figure 5B:
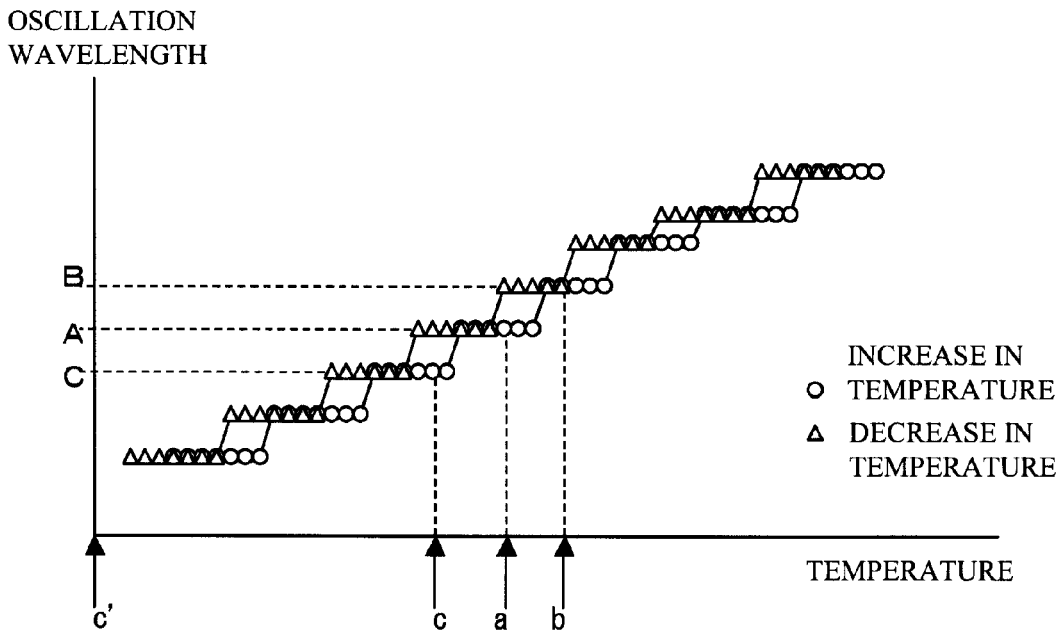
FIG. 5B illustrates a setting value of a wavelength selection portion in a case where the control flowchart of FIG. 5A is executed.

Next, a description will be given of a second embodiment. FIG. 5A illustrates a control flowchart for describing the second embodiment. FIG. 5B illustrates a setting value of a wavelength selection portion in a case where the control flowchart of FIG. 5A is executed. In the first embodiment, in Steps S3 and S4, the changing direction of the setting value of the wavelength selection portion for oscillating at the second wavelength is confirmed, and a control operation is switched according to the changing direction. In the embodiment, the changing direction is not confirmed. The setting value is necessarily initialized when the oscillation wavelength is changed. A description will be given of an operation of the embodiment.

The wavelength-tunable laser 100 oscillates at the first wavelength in Step S11 of FIG. 5A. In the condition, it is assumed that the heaters 30a through 30c are controlled at the point "a" of FIG. 5B. Next, an initial setting value is set on the wavelength selection portion in Step S13, when an instruction is given so as to change the oscillation wavelength to the second wavelength in Step S12. In the embodiment, a changing direction is determined in advance, too. In the embodiment, the changing direction determined in advance is the temperature increasing direction (the changing direction "plus").

The initial setting value is an setting value that is a starting point of the control direction determined in advance. The initial setting value may be a value of a terrace positioned at an end in an opposite direction of the pre-determined changing direction in selectable terraces in the wavelength-tunable laser 100. The initial setting value may be a value on the opposite direction side compared to the end terrace. When the pre-determined changing direction is the increasing direction, the electrical power provided to the heaters 30a through 30c may set to be zero. The temperature condition of the heaters 30a through 30c is the temperature condition "c'" of FIG. 5B with the execution of Step S13, because the initial electrical power provided to the heaters is set to be zero in the embodiment.

Next, a value for achieving the second wavelength is set on the heaters 30a through 30c in Step S14. With the control, the temperature is controlled in a direction corresponding to the changing direction determined in advance. Thus, the temperature is controlled to the target value (the point "c" or "b") finally. It is therefore possible to obtain the desirable wavelength (the wavelength "C" or "B") certainly with the control in accordance with the embodiment.

If the second wavelength is the wavelength "B", the wavelength "B" can be obtained even if the temperature is controlled from the point "a" to the point "b" directly. However, it is not necessary to determine a condition if an initial setting value is set once in the embodiment, even if the target wavelength is anyone. The control is easier in the second embodiment than in the first embodiment, in this point. The second embodiment may be adapted to variable wavelength-tunable lasers as well as the first embodiment.

Third Embodiment

Next, a description will be given of a third embodiment. In the first embodiment and the second embodiment, the control direction to the setting value for achieving the second wavelength is only a single direction when the oscillation wavelength is changed from the first wavelength to the second wavelength. On the other hand, in the wavelength selection portion (the SG-DFB region 10 and the CSG-DBR region 20), the wavelength is controlled to a target value from a non-controlled value at a starting of the wavelength-tunable laser 100 as well as a switching of the wavelength.

In the controlling time, the oscillation wavelength is changed from the wavelength A to the wavelength B or from the wavelength A to the wavelength C described in the first embodiment or the second embodiment. That is, setting values according to a target oscillation wavelength are set on the gain electrode 40, the heaters 30a through 30c and the temperature control device 50 in the wavelength-tunable laser 100 of FIG. 1 in order to obtain a laser oscillation.

At the starting, the wavelength is controlled to the target value from the non-controlled value. Each element to be controlled gets stabilized through a transition period according to each condition. The transition period of the temperature control device 50, the heaters 30a through 30c and so on is changed according to an external temperature. The transition period is variable. Therefore, there is a case where the wavelength is controlled in an area where a terrace in the temperature increasing direction and a terrace in the temperature descending direction have an influence, in the period all controls are not stabilized. In this case, the wavelength-tunable laser 100 may oscillate at a wavelength adjacent to a target wavelength in the area where terraces overlap with each other.

Figure 6A:
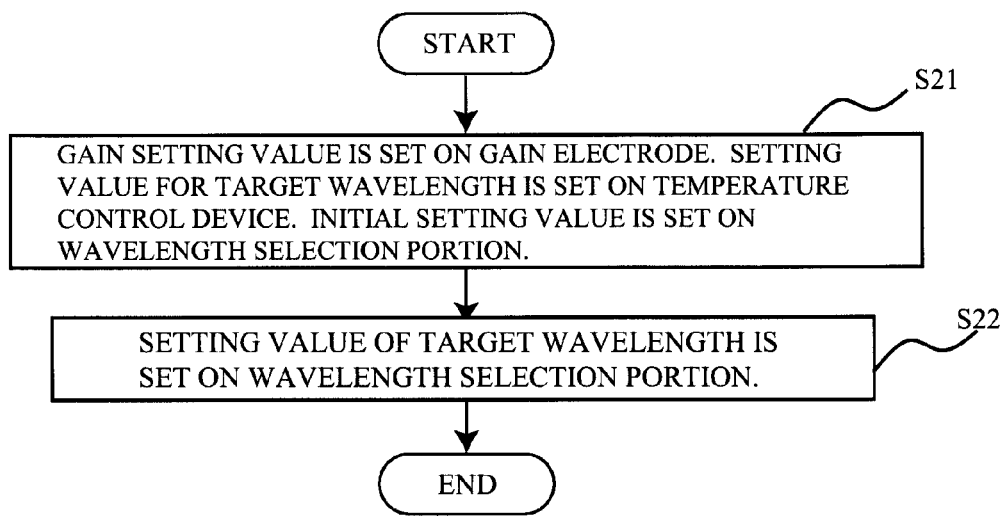
FIG. 6A illustrates a control flowchart for describing a third embodiment.
Figure 6B:
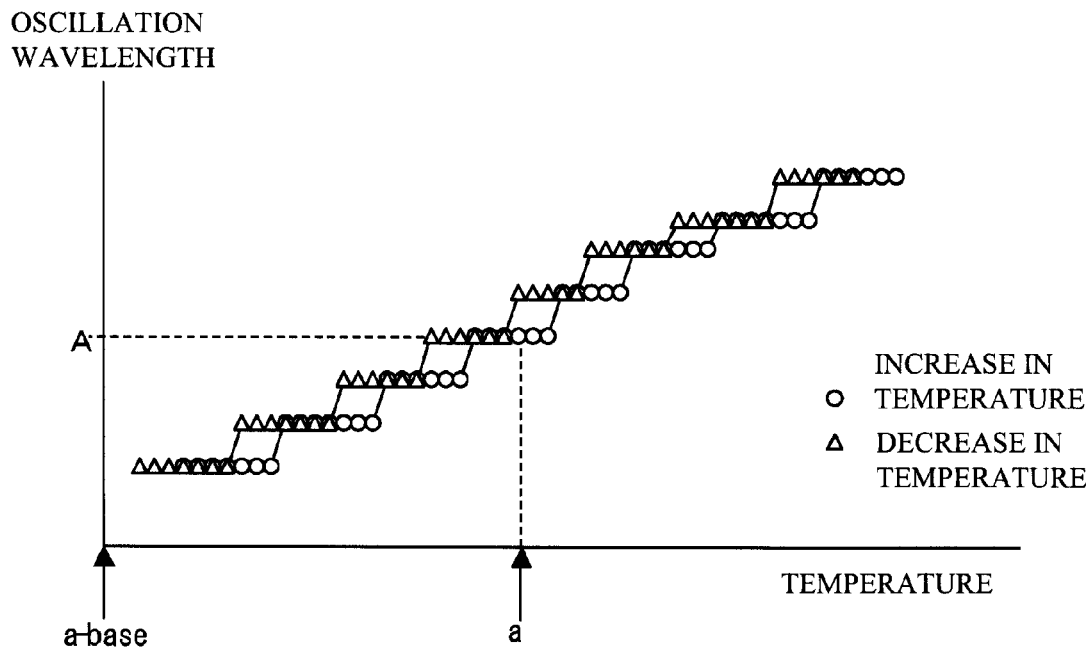
FIG. 6B illustrates a setting value of a wavelength selection portion in a case where the control flowchart of FIG. 6A is executed.

The third embodiment solves the problem. In the third embodiment, the control direction for achieving a target wavelength is a single direction, as well as the first embodiment and the second embodiment. A description will be given of an operation of the third embodiment. FIG. 6A illustrates a control flowchart in accordance with the third embodiment. FIG. 6B illustrates a setting value of a wavelength selection portion in a case where the control flowchart of FIG. 6A is executed.

In the embodiment, at first, a setting value of the wavelength selection portion set an initial setting value, and don't set a target value, at the starting of the wavelength-tunable laser 100. That is, a gain setting value is set on the gain electrode 40, and a setting value for achieving the target wavelength is set on the temperature control device 50, as illustrated in Step S21 of FIG. 6A. In this case, a setting value for achieving the target wavelength (the point "a" of FIG. 6B) is not set on the heaters 30a through 30c acting as the wavelength selection portion, and the initial setting value is set. The temperature control device 50 controls the wavelength selection operation of the wavelength selection portion (the SG-DFB region 10). In the embodiment, the initial setting value is set on the heaters 30a through 30c that is one of a plurality of the wavelength selection portions.

The initial setting value of the second embodiment may be adapted to the third embodiment. That is, the initial setting value may be a value of a terrace positioned at an end in an opposite direction of the pre-determined changing direction in selectable terraces in the wavelength-tunable laser 100 or a value on the opposite direction side compared to the end terrace. In the third embodiment, the changing direction determined in advance is the temperature increasing direction (the changing direction "plus"), and the initial setting value is a value for achieving a condition that no electrical power is provided to the heaters 30a through 30c. In the condition, as illustrated in FIG. 6B, the heaters 30a through 30c are in the temperature condition of the point "a-base".

Next, a setting value for achieving a target wavelength is set on the heaters 30a through 30c in Step S22. That is, the temperature condition is controlled to the point "a" from the point "a-base" illustrated in FIG. 6B. In this case, the heaters 30a through 30c are controlled in the pre-determined direction (the changing direction "plus"), and the heaters 30a through 30c are not controlled in a reverse direction. It is therefore possible to achieve an accurate oscillation wavelength.

Fourth Embodiment

Figure 7A:
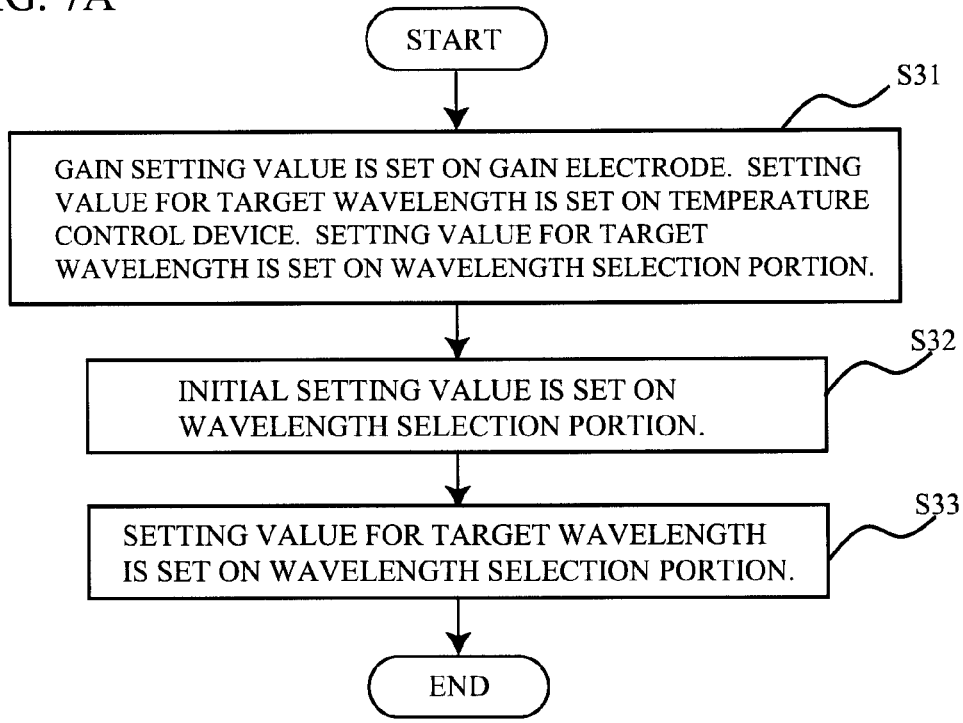
FIG. 7A illustrates a control flowchart for describing a fourth embodiment.
Figure 7B:
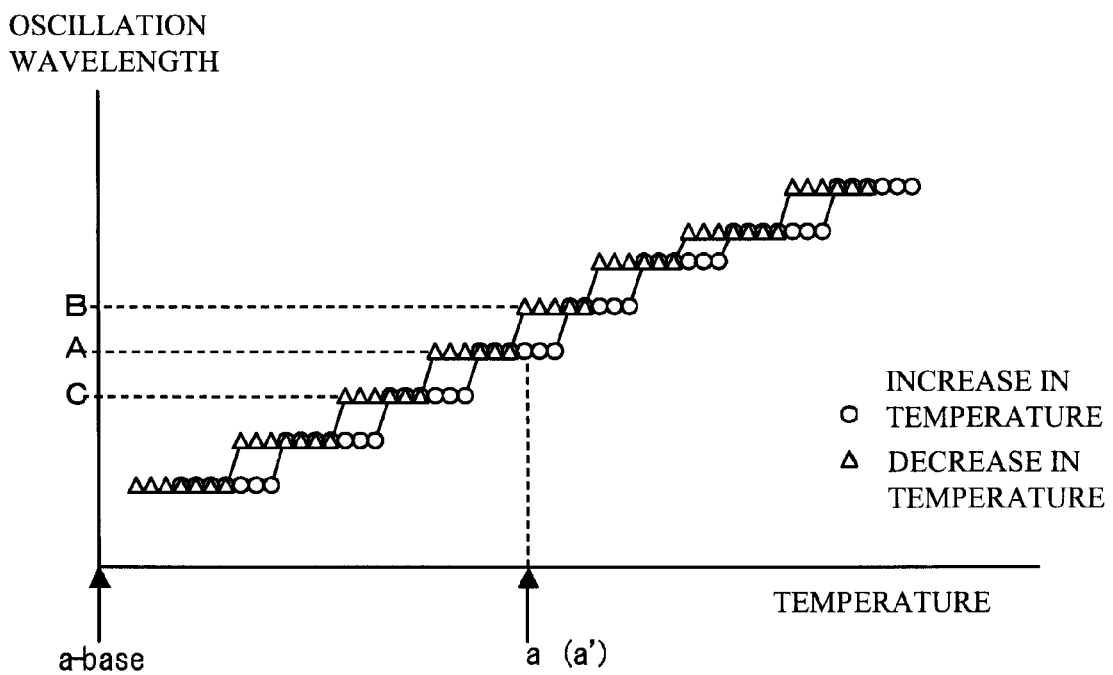
FIG. 7B illustrates a setting value of a wavelength selection portion in a case where the control flowchart of FIG. 7A is executed.

Next, a description will be given of a fourth embodiment. The fourth embodiment is an example of a control at the starting of the wavelength-tunable laser 100 as well as the third embodiment. A description will be given of an operation of the fourth embodiment. FIG. 7A illustrates a control flowchart for describing the fourth embodiment. FIG. 7B illustrates a setting value of the wavelength selection portion in a case where the control flowchart of FIG. 7A is executed.

In the fourth embodiment, all setting values for achieving a target wavelength is set on the wavelength-tunable laser 100 at first, being different from the third embodiment. That is, a gain setting value is set on the gain electrode 40 in Step S31 as illustrated in FIG. 7A. A setting value for achieving the target wavelength is set on the temperature control device 50. A setting value for achieving the point "a", the target wavelength, is set on the heaters 30a through 30c. However, it is possible that the wavelength-tunable laser 100 oscillates at the wavelength "B" or the wavelength "C" that are adjacent to the target wavelength "A", in the condition.

Next, an initial setting value is set on the heaters 30a through 30c in Step S32. The initial setting value may be the same as the initial setting value of the third embodiment. In the fourth embodiment, the changing direction is the temperature increasing direction (the changing direction "plus"). With the control of Step S32, the initial setting value "a-base" is set on the heaters 30a through 30c in Step S32. In the embodiment, the initial setting value of the electrical power set on the heaters 30a through 30c is zero.

Next, a setting value, that is a value according to the point "a'" (="a") of FIG. 7B, for achieving the target wavelength is set on the heaters 30a through 30c in Step S33. With the controls of Step S32 and S33, the heaters 30a through 30c are controlled in the pre-determined direction (the changing direction "plus"), and are not controlled in the reverse direction. This allows an accurate oscillation wavelength.

As mentioned in the above embodiments, the present invention allows an oscillation wavelength with high controllability by determining a control direction for achieving a target wavelength to a single one.

The present invention is not limited to the specifically disclosed embodiments and variations but may include other embodiments and variations without departing from the scope of the present invention.

What is claimed is:

1. A method of controlling a wavelength-tunable laser selecting an oscillation wavelength with a combination of a plurality of wavelength selection portions of which wavelength peak is different from each other,
   in a case where a setting value of at least one of the wavelength selection portions is controlled in a process in which the oscillation wavelength is changed from a first wavelength to a second wavelength,
   comprising:
   a first step of changing a first setting value for achieving the first wavelength set on the wavelength selection portion to an initial setting value acting as a starting point of a control direction determined in advance; and
   a second step of changing the initial setting value set on the wavelength selection portion in the first step to a second setting value for achieving the second wavelength.

2. The method as claimed in claim 1, wherein the initial setting value is a value so that the wavelength selection portion is not controlled.

3. The method as claimed in claim 1, wherein at least one of the plurality of the wavelength selection portions is comprised by a CSG-DBR that has an optical waveguide in which corrugations are formed at an interval, at least two of the intervals being different from each other.

4. The method as claimed in claim 3, wherein at least one of the plurality of the wavelength selection portions is comprised by a SG-DFB that has an optical waveguide in which corrugations are formed at an interval, the intervals being substantially equal to each other.

5. The method as claimed in claim 4, wherein a wavelength property of the CSG-DBR is controlled by a heater.

6. The method as claimed in claim 5, wherein:

the wavelength-tunable laser has a wavelength property of terraces that keeps an oscillation wavelength of the wavelength-tunable laser substantially constant with respect to a temperature variation of the heater; and a position of the terraces are different from each other with respect to a changing direction of the temperature variation.

\* \* \* \* \*